United States Patent
Wu

[11] Patent Number: 6,040,231
[45] Date of Patent: Mar. 21, 2000

[54] METHOD OF FABRICATING A SHALLOW TRENCH ISOLATION STRUCTURE WHICH INCLUDES USING A SALICIDE PROCESS TO FORM AN ASLOPE PERIPHERY AT THE TOP CORNER OF THE SUBSTRATE

[75] Inventor: Der-Yuan Wu, Hsinchu, Taiwan

[73] Assignee: United Microelectronics Corp., Hsin-Chu, Taiwan

[21] Appl. No.: 09/055,684

[22] Filed: Apr. 6, 1998

[30] Foreign Application Priority Data

Jan. 23, 1998 [TW] Taiwan .................................. 87100940

[51] Int. Cl.⁷ .......................... H01L 21/76; H01L 21/311
[52] U.S. Cl. .......................... 438/424; 438/426; 438/435; 438/453; 438/701; 438/702
[58] Field of Search .................................... 438/426, 424, 438/435, 453, 701, 702

[56] References Cited

U.S. PATENT DOCUMENTS 5,578,518  11/1996  Koike et al. .
5,910,018   6/1999  Jang .

Primary Examiner—Richard Booth
Assistant Examiner—Ron Pompey

[57] ABSTRACT

A method of forming a shallow trench isolation structure is disclosed. The method comprises providing a substrate; forming a first oxide layer, a stop layer and a second oxide layer successively on the substrate; patterning the second oxide layer, the stop layer and the first oxide layer and a portion of the substrate to form a trench wherein the trench has a top corner. Then, a recess is formed at the periphery of the pad oxide layer, using the salicide process to form an aslope periphery at the top corner. Consequently, kink effect is improved, leakage current is reduced and the performance of the device is enhanced.

47 Claims, 3 Drawing Sheets

METHOD OF FABRICATING A SHALLOW TRENCH ISOLATION STRUCTURE WHICH INCLUDES USING A SALICIDE PROCESS TO FORM AN ASLOPE PERIPHERY AT THE TOP CORNER OF THE SUBSTRATE

CROSS-REFERENCE TO RELATED APPLICATION

This application claims the priority benefit of Taiwan application Ser. No. 87100940, filed Jan. 23, 1998, the full disclosure of which is incorporated herein by reference.

BACKGROUND OF THE INVENTION

1. Field of the Invention

The invention relates in general to the fabrication of an integrated circuit (IC) device, and more particularly to a method of fabricating a shallow trench isolation (STI) structure, preventing the occurrence of kink effect.

2. Description of the Related Art

An IC device is usually composed of millions of metal-oxide semiconductor field effect transistors (MOSFET). For example, a dynamic random access memory (DRAM) is a typical IC device with high dense. Therefore, isolation structures of a high integration IC device are now of great interest since inferior isolation structures may cause short circuit between adjacent transistors. One of the most common used isolation structures is local oxidation (LOCOS), which is an isolation technique by forming thick field oxide extending an the substrate surface. The LOCOS technique is now a mature process with high reliability and efficiency. However, there are still several drawbacks of LOCOS, including stress, consequential problems due to stress and the formation of bird's beak. In particular, the problems resulted from bird's beak cause ineffective isolation. Therefore, a newly developed isolation structure, shallow trench isolation (STI) structure, becomes more popular.

A typical STI process is described as followed. Referring to FIG. 1A, a pad oxide layer and a silicon nitride layer are successively formed on a substrate 100, using thermal oxidation and chemical vapor deposition (CVD), respectively.

Next, after spin coating a photoresist layer, the wafer is processed through photolithography and etching to define the STI regions. The defining processes includes: covering a photresist layer over the wafer, patterning the photoresist layer by exposure and development, using the patterned photo resist layer 106 as a mask to etch to form a patterned pad oxide layer 102, a patterned silicon nitride layer 104, a patterned oxide layer 112 and a shallow trenches 107 down to the substrate.

Referring to FIG. 1B, after removing the photoresist layer 106, a liner oxide layer 110 is formed on the inner surface 101 of the shallow trench 107 by thermal oxidation. A further oxide layer 108 is deposited in the trenches 107 by atmosphere pressure chemical vapor deposition (APCVD) and then processed through densification.

Referring to FIG. 1C, the CVD oxide layer 108 and the oxide layer 112 are processed through chemical mechanical polishing (CMP), in the existence of slurry. The CMP is continuously performed until exposing the silicon nitride layer 104 to form an even CVD oxide layer 108a.

Referring to FIG. 1D, the silicon nitride layer 104 is first removed by hot phosphoric acid and then the pad oxide layer 102 is removed by hydrofluoric acid. However, the hydrofluoric acid may also erode the corner of the even oxide layer 108a and damage the oxide layer 108b. Therefore, a recesses 111 is formed.

Referring to FIG. 1D, charge accumulation tends to occur at the recesses 111 and consequently sub-threshold leakage current usually comes out, which is so-called kink effect. The abnormal kink effect reduces the quality of the devices, and also reduces the yield, which is undesired.

SUMMARY OF THE INVENTION

It is therefore an object of the invention to provide a method of fabricating a STI structure with an aslope periphery at the top corner of the substrate, which consequently prevents charge accumulation and the sub-threshold leakage current, kink effect due to it.

A method of fabricating a shallow trench isolation structure is disclosed. On a substrate, a first oxide layer, a stop layer and a second oxide layer are successively formed. The second oxide layer, the stop layer and the first oxide layer and a portion of the substrate are patterned to form a trench. A recess is formed at the periphery of the first oxide layer. A metal layer is formed at the trench and the recess. A thermal treatment process is performed so that a portion of the metal layer contacting with the substrate transforms to be a metal silicide layer. The metal silicide layer and the rest of the metal layer are removed so that the top corner of the trench becomes an aslope periphery.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
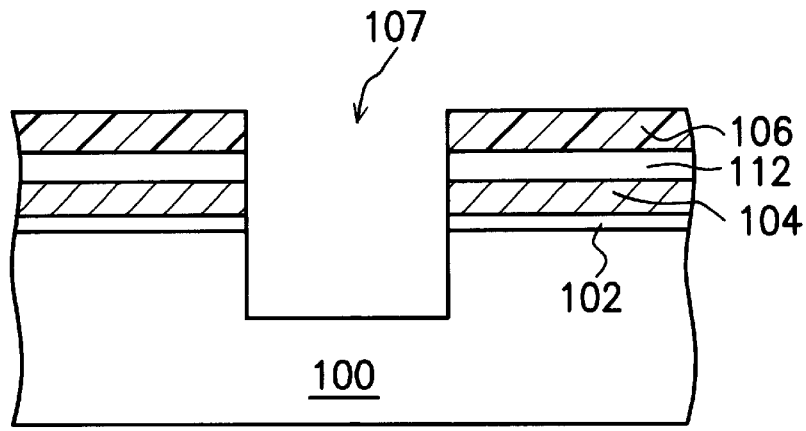
FIGS. 1A to 1D are cross-sectional views showing the conventional process steps of fabricating a STI structure.
Figure 1B:
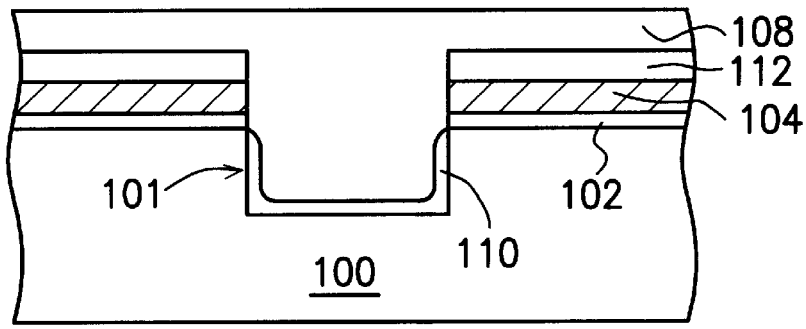
Figure 1C:
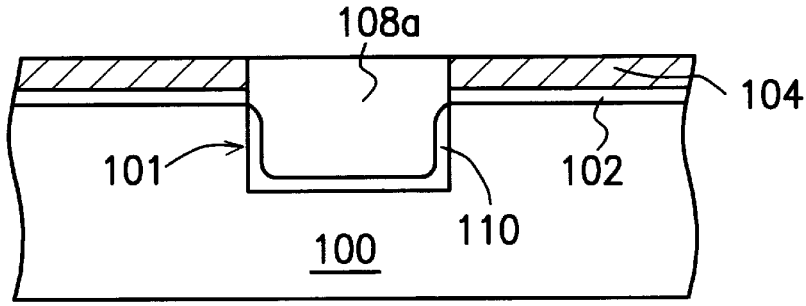
Figure 1D:
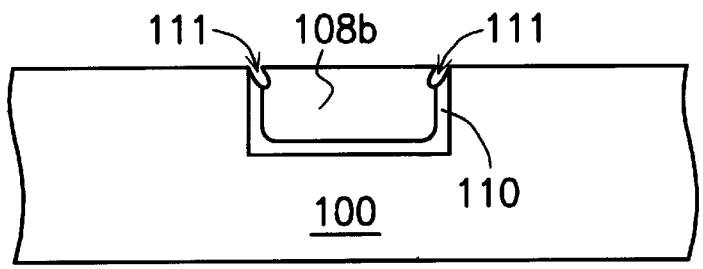
Figure 2A:
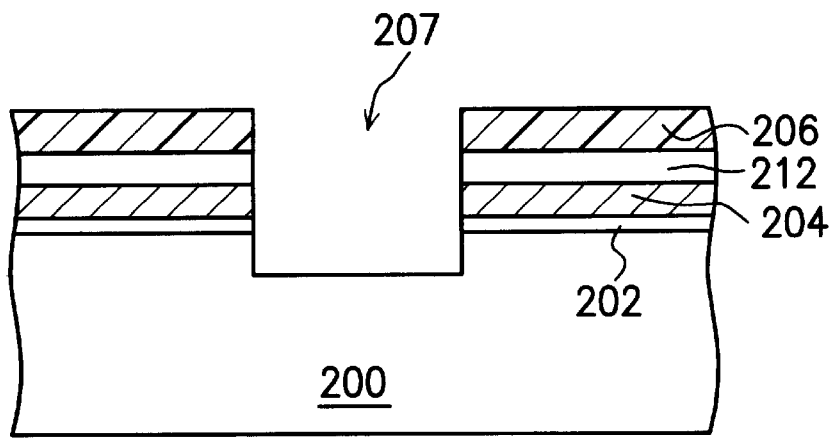
FIGS. 2A to 2G are cross-sectional views showing the process steps of fabricating a STI structure in accordance with a preferred embodiment of the invention.

Referring to FIG. 2A, on a provided semiconductor substrate 200, a pad oxide layer and a silicon nitride layer are successively formed by thermal oxidation and chemical vapor deposition (CVD), respectively. Next, after spin coating a photoresist layer, the wafer is processed through photolithography and etching to define the STI regions. The defining processes includes: covering a photresist layer over the wafer, patterning the photoresist layer by exposure and development, using the patterned photo resist layer 206 as a mask to etch to form a patterned pad oxide layer 202, a patterned silicon nitride layer 204, a patterned oxide layer 212 and a shallow trenches 207 down to the substrate.

Figure 2B:
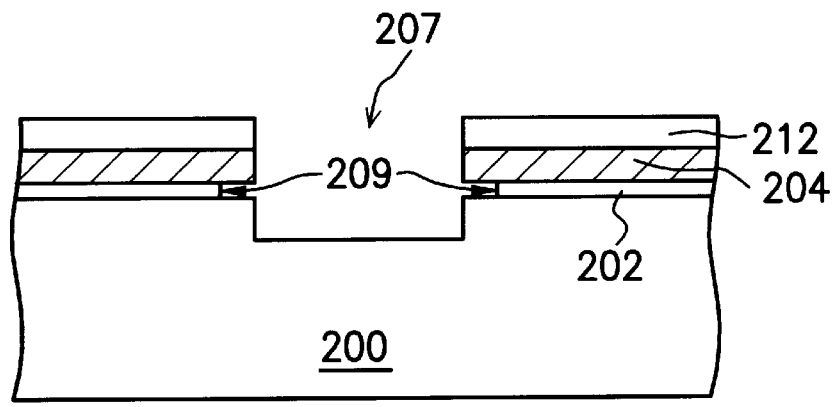

Referring to FIG. 2B, the photoresist layer 206 is removed. Next, the device is deposited in RCA cleaning solution or hydrofluoric acid to remove a portion of the pad oxide layer 202 at the periphery. Consequently, a recess 209 is formed at the periphery of the pad oxide layer 202.

Figure 2C:
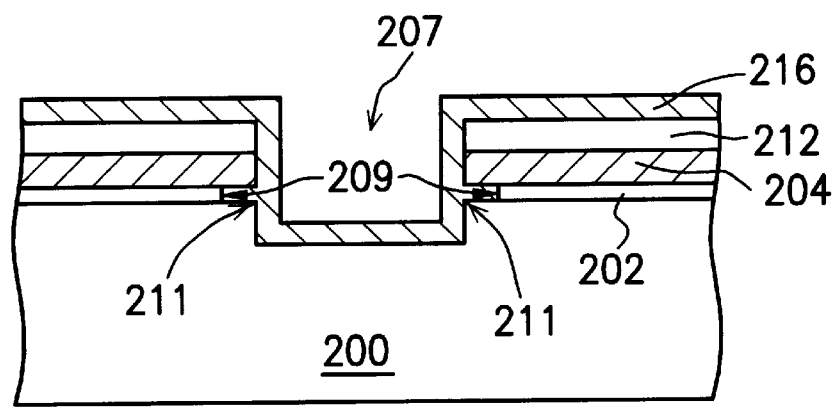

Referring to FIG. 2C, a titanium layer 216 is formed over the whole semiconductor substrate 200, preferably, by a self-aligned silicide (salicide) process. The self-aligned silicide process can includes using, for example, physical vapor deposition (PVD) or CVD to form the titanium layer 216 over the semiconductor substrate 200.

Figure 2D:
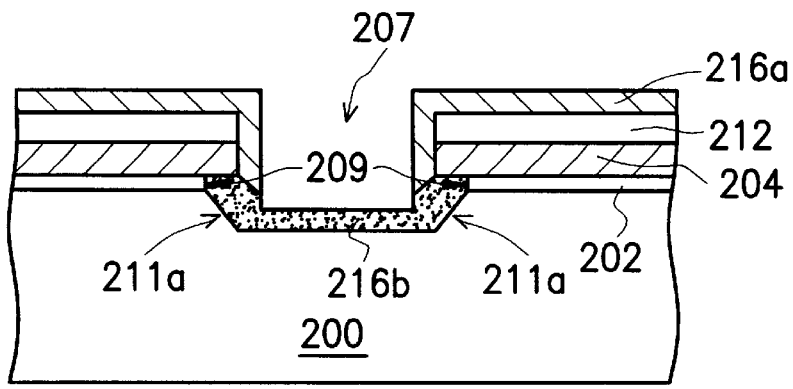

Referring to FIG. 2D, during the self-aligned silicide process, the device is rapidly heated to a temperature of about 700° C., which is the so-called rapid thermal process (RTP). Therefore, the portion of the titanium layer 216 contacting with the silicon substrate 200 is reacted to form a titanium silicide layer 216b. Another portion of titanium layer 216 not contacting with the silicon substrate 200 remains as the original titanium layer 216a. Due to the existence of the recess 209, a larger amount of titanium is filled into the recess 209 so that the titanium in the recess 209 and the titanium at the top corner 211 of the semiconductor substrate 200 will transform to a thicker titanium silicide than the titanium silicide at other positions after rapid thermal process. Consequently, after the reaction, the top corner of the semiconductor substrate 200 becomes less slant and forms an aslope periphery 211a.

Figure 2E:
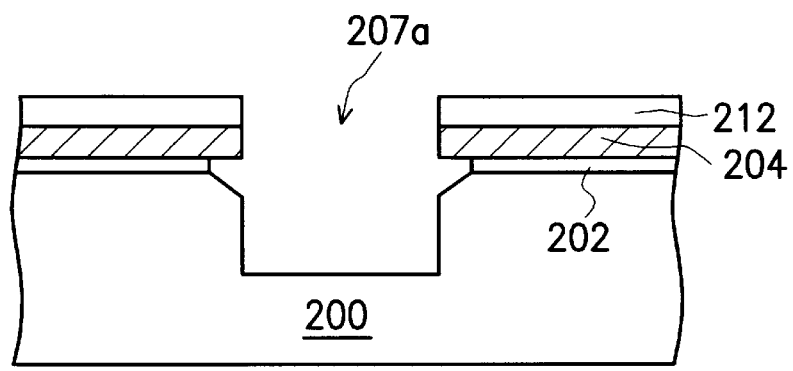

Referring to FIG. 2E, the titanium layer 216a and the titanium silicide layer 216b are removed by, for example, dipped in the RCA cleaning solution or hydrofluoric acid. Then, a portion of the silicon substrate 200 under the trench 207 is removed to form a shallow trench 207a. The depth of the shallow trench 207a is adjusted to be suitable for forming isolation structure. This can be achieved by, for example, using dry etching to remove the portion of the silicon substrate 200 under the trench 207.

Figure 2F:
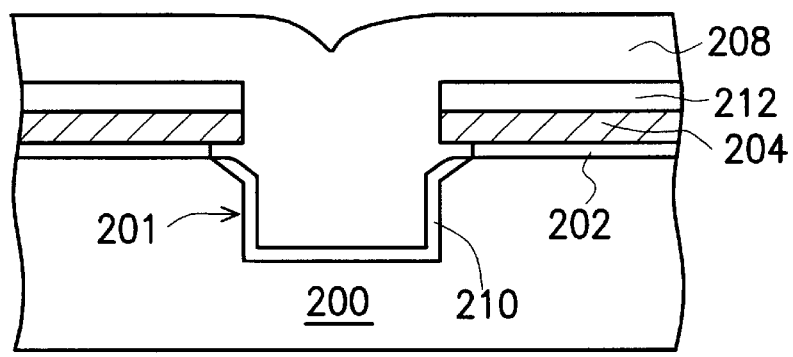

Referring to FIG. 2F, a liner oxide layer 210 is formed on the inner surface 201 of the shallow trench 207a preferrably by thermal oxidation. Subsequently, an oxide layer 208 is deposited over the whole device, above the oxide layer 212 and filling in the trench 207a.

Figure 2G:
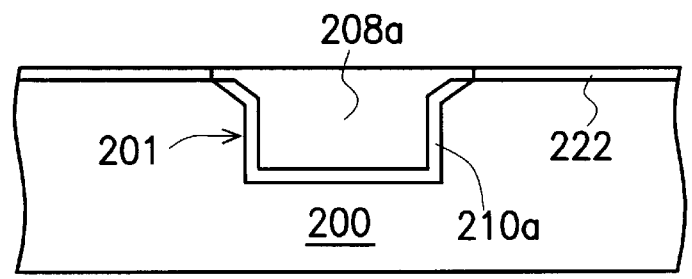

Then, referring to FIG. 2G, the CVD oxide layer 208 is preferably processed through chemical mechanical polishing (CMP), in the existence of slurry. The CMP is continuously performed until exposing the silicon nitride layer 204 to form an even CVD oxide layer 208. The silicon nitride layer 204 is first removed by hot phosphoric acid and then the pad oxide layer 202 is removed by hydrofluoric acid. A gate oxide layer 222 is then formed on the semiconductor substrate 200 by, for example, thermal oxidation. The shallow trench isolation structure is by now completed, which includes the CVD oxide layer 208a and the liner oxide layer 210a.

It is therefore apparent that the present includes the following characteristics: first, forming recess 209 at the periphery of the pad oxide layer, using the salicide process to form an aslope periphery at the top corner. Consequently, kink effect is improved, leakage current is reduced and the performance of the device is enhanced.

While the invention has been described by way of example and in terms of a preferred embodiment, it is to be understood that the invention is not limited thereto. To the contrary, it is intended to cover various modifications and similar arrangements and procedures, such as the formation of a multiple voltage transistor. The scope of the appended claims therefore should be accorded the broadest interpretation so as to encompass all such modifications and similar arrangements and procedures.

What is claimed is:

1. A method of fabricating a shallow trench isolation structure, comprising:

providing a substrate;

forming a first oxide layer, a stop layer and a second oxide layer successively on the substrate, wherein the first oxide layer has a periphery;

patterning the second oxide layer, the stop layer and the first oxide layer and a portion of the substrate to form a trench;

forming a recess at the periphery of the first oxide layer;

forming a metal layer at the trench and the recess;

performing a thermal treatment process so that a portion of the metal layer contacting with the substrate transforms to be a metal silicide layer; and removing the metal silicide layer and the rest of the metal layer so that the top corner of the substrate becomes an aslope periphery.

2. A method as claimed in claim 1, wherein the first oxide layer includes a pad oxide layer.

3. A method as claimed in claim 2, wherein the first oxide layer is formed by thermal oxidation.

4. A method as claimed in claim 1, wherein the second oxide layer includes a silicon dioxide layer.

5. A method as claimed in claim 4, wherein the second oxide layer includes chemical vapor deposition.

6. A method as claimed in claim 1, wherein the stop layer includes a silicon nitride layer.

7. A method as claimed in claim 6, wherein the stop layer is formed by chemical vapor deposition.

8. A method as claimed in claim 1, wherein the trench is formed by anisotropic dry etching.

9. A method as claimed in claim 1, wherein the recess is formed by etching.

10. A method as claimed in claim 9, wherein the etchant includes RCA cleaning solution.

11. A method as claimed in claim 9, wherein the etchant includes hydrofluoric acid.

12. A method as claimed in claim 1, wherein the metal layer includes titanium.

13. A method as claimed in claim 12, wherein the metal layer is formed by physical vapor deposition.

14. A method as claimed in claim 12, wherein the metal layer is formed by chemical vapor deposition.

15. A method as claimed in claim 1, wherein the metal silicide layer includes titanium silicide.

16. A method as claimed in claim 1, wherein the thermal treatment process is a rapid thermal process.

17. A method as claimed in claim 16, wherein the thermal treatment process is at about 700° C.

18. A method as claimed in claim 1, wherein the metal silicide layer and the rest of the metal layer are removed by etching.

19. A method as claimed in claim 18, wherein an etchant includes RCA cleaning solution.

20. A method as claimed in claim 18, wherein an etchant includes hydrofluoric acid.

21. A method of fabricating a shallow trench isolation structure, comprising:

providing a substrate;

forming a first oxide layer, a stop layer and a second oxide layer successively on the substrate, wherein the first oxide layer has a periphery;

patterning the second oxide layer, the stop layer, the first oxide layer and a portion of the substrate to form a trench;

forming a recess at the periphery of the first oxide layer;

depositing a metal layer in the trench and the recess;

performing a thermal treatment process so that a portion of the metal layer contacting with the substrate transforms to be a metal silicide layer;

removing the metal silicide layer and the rest of the metal layer so that the top corner of the substrate becomes an aslope periphery;

further etching the trench to become an isolation trench, wherein the isolation trench has an inner surface;

forming a third oxide layer on the inner surface of the isolation trench;

depositing a fourth oxide layer in the isolation trench and over the substrate;

performing a planarization process to planarize the fourth oxide layer and the second oxide layer until exposing the stop layer;

removing the stop layer; and forming a gate oxide layer.

22. A method as claimed in claim 21, wherein the first oxide layer includes a pad oxide layer.

23. A method as claimed in claim 22, wherein the first oxide layer includes thermal oxidation.

24. A method as claimed in claim 21, wherein the second oxide layer includes a silicon dioxide layer.

25. A method as claimed in claim 24, wherein the second oxide layer is formed by chemical vapor deposition.

26. A method as claimed in claim 21, wherein the stop layer includes silicon nitride.

27. A method as claimed in claim 26, wherein the stop layer is formed by chemical vapor deposition.

28. A method as claimed in claim 21, wherein the trench is formed by anisotropic dry etching.

29. A method as claimed in claim 21, wherein the recess is formed by etching.

30. A method as claimed in claim 29, wherein an etchant includes RCA cleaning solution.

31. A method as claimed in claim 29, wherein an etchant includes hydrofluoric acid.

32. A method as claimed in claim 21, wherein the metal layer includes titanium.

33. A method as claimed in claim 32, wherein the metal layer is formed by physical vapor deposition.

34. A method as claimed in claim 32, wherein the metal layer is formed by chemical vapor deposition.

35. A method as claimed in claim 21, wherein the metal silicide layer includes titanium silicide.

36. A method as claimed in claim 21, wherein the thermal treatment process includes rapid thermal process.

37. A method as claimed in claim 36, wherein the thermal treatment process is at about 700° C.

38. A method as claimed in claim 21, wherein the metal silicide layer and the rest of the metal layer are removed by etching.

39. A method as claimed in claim 38, wherein an etchant includes RCA cleaning solution.

40. A method as claimed in claim 38, wherein an etchant includes hydrofluoric acid.

41. A method as claimed in claim 21, wherein the isolation trench is formed by anisotropic dry etching.

42. A method as claimed in claim 21, wherein the third oxide layer includes liner oxide.

43. A method as claimed in claim 42, wherein the third oxide layer is formed by thermal oxidation.

44. A method as claimed in claim 21, wherein the fourth oxide layer is a CVD (chemical vapor deposition) oxide layer.

45. A method as claimed in claim 21, wherein the silicon nitride layer is removed by using hot phosphoric acid.

46. A method as claimed in claim 21, wherein the gate oxide layer includes silicon dioxide layer.

47. A method as claimed in claim 46, wherein the gate oxide layer is formed by thermal oxidation.

* * * * *